US007482885B2

(12) United States Patent
Sridharan

(10) Patent No.: US 7,482,885 B2
(45) Date of Patent: Jan. 27, 2009

(54) METHOD OF FREQUENCY SYNTHESIS FOR FAST SWITCHING

(75) Inventor: Kartik M. Sridharan, San Diego, CA (US)

(73) Assignee: Orca Systems, Inc., Poway, CA (US)

( * ) Notice: Subject to any disclaimer, the term of this patent is extended or adjusted under 35 U.S.C. 154(b) by 0 days.

(21) Appl. No.: 11/321,110

(22) Filed: Dec. 29, 2005

(65) Prior Publication Data

US 2007/0152757 A1 Jul. 5, 2007

(51) Int. Cl.
*H03B 5/12* (2006.01)
*H03B 1/00* (2006.01)

(52) U.S. Cl. .......................... 331/49; 331/74; 331/1 A
(58) Field of Classification Search ............ 331/23, 331/49, 16, 34, 1 A, 175, 177 R, 179, 74; 377/48, 47; 375/373–376
See application file for complete search history.

(56) References Cited

U.S. PATENT DOCUMENTS

| | | | |
|---|---|---|---|
| 4,609,881 A | 9/1986 | Wells | |
| 5,038,117 A | 8/1991 | Miller | |
| 5,053,728 A | 10/1991 | Bögl | |
| 5,055,800 A | 10/1991 | Black et al. | |
| 5,055,802 A | 10/1991 | Hietala et al. | |
| 5,070,310 A | 12/1991 | Hietala et al. | |
| 5,093,632 A | 3/1992 | Hietala et al. | |
| 5,111,162 A * | 5/1992 | Hietala et al. ............... 332/127 |
| 5,146,186 A | 9/1992 | Vella | |
| 5,266,907 A | 11/1993 | Dacus | |
| 5,430,890 A | 7/1995 | Vogt et al. | |
| 5,446,767 A | 8/1995 | Nakagawa et al. | |
| 5,563,535 A | 10/1996 | Corry et al. | |
| 5,604,468 A | 2/1997 | Gillig | |
| 5,757,239 A * | 5/1998 | Gilmore ....................... 331/18 |
| 5,777,521 A | 7/1998 | Gillig et al. | |
| 5,790,612 A * | 8/1998 | Chengson et al. ........... 375/373 |
| 5,894,592 A * | 4/1999 | Brueske et al. ................ 455/86 |
| 5,920,233 A | 7/1999 | Denny | |
| 6,008,703 A | 12/1999 | Perrott et al. | |
| 6,008,704 A | 12/1999 | Opsahl et al. | |
| 6,047,029 A | 4/2000 | Eriksson et al. | |
| 6,066,989 A | 5/2000 | Knecht et al. | |
| 6,094,101 A | 7/2000 | Sander et al. | |
| 6,094,569 A | 7/2000 | Wang | |

(Continued)

FOREIGN PATENT DOCUMENTS

JP 4-212522 A 8/1992

(Continued)

OTHER PUBLICATIONS

International Search Report for International Application No. PCT/US2006/049330; mailed Jul. 25, 2007; 3 pages.

*Primary Examiner*—Robert Pascal
*Assistant Examiner*—Ryan J. Johnson
(74) *Attorney, Agent, or Firm*—Foley & Lardner LLP

(57) ABSTRACT

A digital frequency synthesizer can be implemented with single source design, a multiplexer design, a fractional divider design, or a frequency multiplier and frequency divider design. Implementations can utilize a controller dithering circuit or a delta-sigma modulator. The frequency synthesizer can be implemented in a CMOS structure and can utilize a clean up phase locked loop (PLL).

25 Claims, 7 Drawing Sheets

U.S. PATENT DOCUMENTS

| | | | |
|---|---|---|---|
| 6,172,579 | B1 | 1/2001 | Dacus et al. |
| 6,219,397 | B1 | 4/2001 | Park |
| 6,236,703 | B1 | 5/2001 | Riley |
| 6,321,075 | B1 | 11/2001 | Butterfield |
| 6,326,851 | B1 * | 12/2001 | Staszewski et al. ........... 331/17 |
| 6,359,950 | B2 | 3/2002 | Gossmann et al. |
| 6,404,291 | B1 | 6/2002 | Riley |
| 6,414,555 | B2 | 7/2002 | Staszewski et al. |
| 6,429,693 | B1 | 8/2002 | Staszewski et al. |
| 6,429,707 | B1 | 8/2002 | Lamb et al. |
| 6,433,643 | B1 | 8/2002 | Opsahl et al. |
| 6,483,388 | B2 | 11/2002 | Khan |
| 6,504,437 | B1 | 1/2003 | Nelson et al. |
| 6,504,498 | B1 | 1/2003 | O'Brien |
| 6,515,553 | B1 | 2/2003 | Filiol et al. |
| 6,525,609 | B1 | 2/2003 | Behzad |
| 6,542,044 | B1 | 4/2003 | Berquist et al. |
| 6,553,089 | B2 | 4/2003 | Huh et al. |
| 6,570,452 | B2 | 5/2003 | Sridharan |
| 6,597,250 | B2 | 7/2003 | Jovenin |
| 6,600,378 | B1 | 7/2003 | Patana |
| 6,614,319 | B2 | 9/2003 | Saeki et al. |
| 6,670,854 | B2 | 12/2003 | Takeda et al. |
| 6,690,215 | B2 | 2/2004 | McCune, Jr. et al. |
| 6,693,494 | B2 | 2/2004 | Fan |
| 6,704,908 | B1 | 3/2004 | Horan et al. |
| 6,707,855 | B2 | 3/2004 | Patana |
| 6,708,026 | B1 | 3/2004 | Klemmer et al. |
| 6,710,664 | B2 | 3/2004 | Humphreys et al. |
| 6,710,951 | B1 * | 3/2004 | Cloke .......................... 360/29 |
| 6,717,998 | B2 | 4/2004 | Adachi et al. |
| 6,734,741 | B2 | 5/2004 | Staszewski et al. |
| 6,791,422 | B2 | 9/2004 | Staszewski et al. |
| 6,822,593 | B2 | 11/2004 | Level et al. |
| 6,823,033 | B2 | 11/2004 | Fahim |
| 6,825,729 | B2 | 11/2004 | Splett |
| 6,829,311 | B1 | 12/2004 | Riley |
| 6,834,183 | B2 | 12/2004 | Black et al. |
| 6,836,526 | B2 | 12/2004 | Rana |
| 6,838,951 | B1 | 1/2005 | Nieri et al. |
| 6,844,758 | B2 | 1/2005 | Smith |
| 6,844,836 | B1 | 1/2005 | Lee |
| 6,873,213 | B2 | 3/2005 | Tsuda et al. |
| 6,897,796 | B2 | 5/2005 | Dias et al. |
| 6,931,243 | B2 | 8/2005 | Goldman |
| 6,933,798 | B2 | 8/2005 | Hammes et al. |
| 6,941,116 | B2 | 9/2005 | Jensen et al. |
| 6,941,330 | B2 | 9/2005 | Jackson et al. |
| 6,946,884 | B2 | 9/2005 | Holland et al. |
| 6,946,915 | B2 | 9/2005 | Zhang |
| 6,952,138 | B2 | 10/2005 | Hagberg et al. |
| 7,146,144 | B2 * | 12/2006 | Robinson et al. ............ 455/260 |
| 2002/0168038 | A1 * | 11/2002 | Damgaard et al. .......... 375/344 |
| 2004/0066240 | A1 | 4/2004 | Staszewski et al. |

FOREIGN PATENT DOCUMENTS

| | | |
|---|---|---|
| JP | 2001-237709 A | 8/2001 |
| WO | WO 97/06600 A1 | 2/1997 |

* cited by examiner

METHOD OF FREQUENCY SYNTHESIS FOR FAST SWITCHING

BACKGROUND OF THE INVENTION

The present application generally relates to communication circuits and systems and more specifically to frequency synthesizers using a novel open-loop generation method. More particularly, the present application relates to frequency synthesizers capable of fast switching, frequency synthesizers capable of providing precise, high frequency clock references, and/or frequency synthesizers for use in communication equipment.

According to one particular application, radio frequency (RF) signal generation in mobile communication equipment, frequency synthesizers are utilized to provide a frequency source for a number of communication channels. In general, conventional frequency synthesizers have employed integer or fractional phase locked loops (PLLs) to generate a frequency signal. These conventional frequency synthesizers (PLL-based frequency synthesizers) utilize a phase locked loop comprised of a loop filter, a comparator circuit, and a voltage controlled oscillator. These conventional PLL-based frequency synthesizers also have used dithering, and delta-sigma dithering methods to generate the fractional frequencies.

The oscillator has a control input coupled to the loop filter. The output of the comparator circuit is coupled to the loop filter. A first input of the comparator circuit is coupled to an integer divider and a delta-sigma averaging circuit. A second input of the comparator circuit is coupled to a reference signal. The combination of the integer divider and the delta-sigma averaging circuit constitute a fractional divider. The reference frequency signal can be generated from a crystal or other device. A delta-sigma fractional synthesizer is disclosed in U.S. Pat. No. 4,609,881 issued to Wells on Sep. 2, 1986.

Generally, such PLL-based frequency synthesizers are disadvantageous because they cannot be readily integrated on digital integrated circuits (ICs or chips). PLL-based frequency synthesizers require more expensive process technologies and are not compatible with the same CMOS technology that is used for base band and other digital control circuitry. As process technologies shrink in size, it becomes even more desirous to provide a radio architecture which is compatible with CMOS processes. U.S. Pat. Publication No. 2004/0066240 discusses certain advantages of migrating to digitally intensive synthesizer architectures.

In communication applications, the frequency synthesizer must often be capable of producing precise, high frequency clock references. Heretofore, most conventional synthesizers have utilized analog intensive designs to achieve precise, high frequency clock references. These conventional analog designs cannot take advantage of the digital processing capability inherent in advanced CMOS logic devices.

Therefore, there is a need for a frequency synthesizer that is more compatible with digital designs. Further still, there is a need for a synthesizer that does not utilize a conventional PLL-based design. Further still, there is a need to integrate frequency synthesizers into CMOS logic devices. Further still, there is a need for a frequency synthesizer capable of fast switching which does not have the traditional problems associated with analog-intensive designs. Yet further still, there is a need for a digital frequency synthesizer capable of producing precise high frequency clock signals.

SUMMARY OF THE INVENTION

An exemplary embodiment relates to a digital frequency synthesizer. The digital frequency synthesizer includes at least one source for providing a plurality of digital frequency signals, a plurality of switches, and a control circuit. Each of the digital frequency signals is provided at a distinct frequency. The switches are coupled to receive the digital frequency signals. The control circuit is coupled to the switches and controls the switches to select the digital frequency signals to provide an output signal.

According to one embodiment, the output frequency is the average of the digital frequency sources-as determined by a dithering sequence. For example, if Tone 1 is 890 MHz and Tone 2 is 900 MHz, and if the dithering sequence is Tone1, Tone2, Tone1, Tone2 . . . , then the output frequency is 895 MHz. As another example, if the dithering sequence is Tone1, Tone1, Tone1, Tone2, . . . , then the output frequency is 892.5 MHz. Thus, the dithering sequence and the tone frequencies determine the final output frequency. This dithering sequence can be performed by a control circuit embodied as a sigma delta modulator, or any other dithering sequence generator. An exemplary structure for a dithering sequence generator is in U.S. Pat. No. 4,609,881.

Another exemplary embodiment relates to a digital frequency synthesizer. The digital frequency synthesizer includes a frequency multiplier, a delta-sigma or other dithering circuit, and a fractional input. The frequency multiplier has a clock input, a second input, and a multiplier output. The multiplier receives a clock signal at the clock input and provides a frequency signal at the multiplier output that is the input clock frequency times the multiplication number as set by the second input. The delta-sigma or other dithering circuit has a dithering output that provides a signal representing an "integer+fraction" for the desired multiplication. The delta-sigma/dithering output is coupled to the second input. The fractional input is coupled to the delta-sigma or other dithering circuit input. The fractional input provides an input signal that represents the fraction factor by which one wants the input clock frequency to be multiplied.

Still another exemplary embodiment relates to a digital frequency synthesizer. The digital frequency synthesizer includes a frequency source for providing a first signal at a first frequency, a frequency multiplier for receiving the first signal and providing a second signal at a second frequency, and a variable frequency divider. The digital frequency synthesizer also includes a delta-sigma modulator or any other dithering circuit. The second frequency is at a fixed multiple of the first frequency. The frequency divider receives the second signal and provides a third signal having an average third frequency. The average third frequency is less than the second frequency. The delta-sigma modulator or other dithering circuit controls the divider so that the third frequency is the average of a dithering sequence from the dithering circuit.

An exemplary embodiment relates to a signal source. The signal source includes a digital frequency synthesizer for providing a frequency signal and a phase lock loop clean-up circuit. The phase lock loop clean-up circuit is coupled to receive the frequency signal and provide a clean-up frequency signal. The digital frequency synthesizer can utilize: 1. at least one digital frequency source, switches and a dithering control circuit controlling the switches; 2. a frequency multiplier and a dithering circuit coupled to the multiplier to provide an output signal at a frequency related to an integer plus a fraction; 3. a single digital frequency source capable of providing a sequence of frequency signals at distinct frequencies; or 4. a frequency multiple and variable frequency divider.

Another exemplary embodiment relates to a digital frequency synthesizer including at least one digital frequency source for providing a plurality of digital frequency signals and a control circuit. The digital frequency signals are provided at distinct frequencies. The control circuit controls the digital frequency source to provide an output signal having an average frequency at a first frequency. The average frequency being within a range of the distinct frequencies.

BRIEF DESCRIPTION OF THE DRAWINGS

Preferred exemplary embodiment will hereinafter be described in conjunction with the appended drawings, wherein like numerals denote like elements and.

7 is an electrical schematic block diagram of a frequency synthesizer and a PLL circuit for cleaning output signals provided by the frequency synthesizers illustrated in any of FIGS. 1, 4, or 5 in accordance with still yet another exemplary embodiment.

DETAILED DESCRIPTION OF PREFERRED EMBODIMENTS

Figure 1:
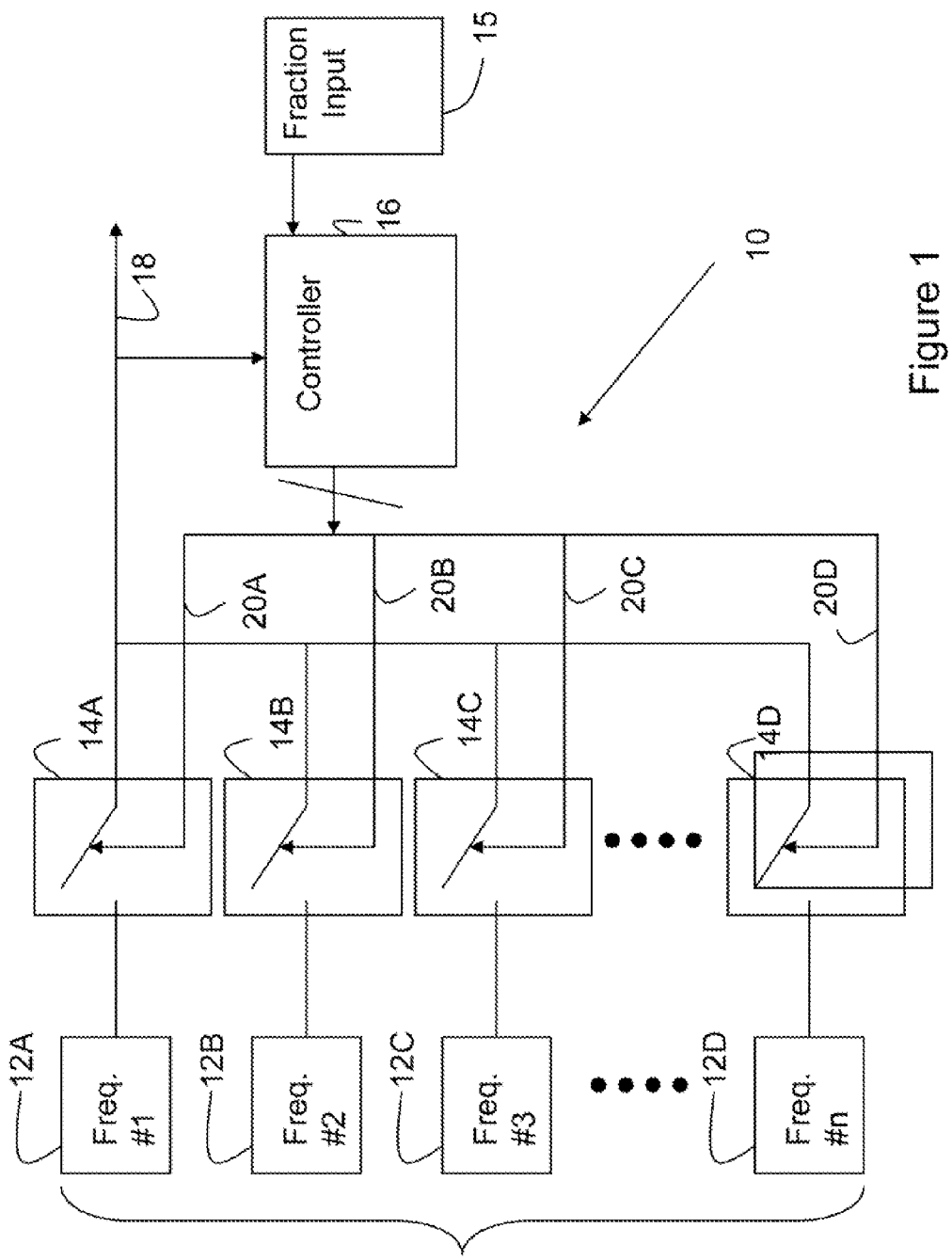
FIG. 1 is an electrical schematic block diagram of a digital frequency synthesizer in accordance with an exemplary embodiment.

With reference to FIG. 1, a digital frequency synthesizer 10 can be utilized in any application requiring the generation of a frequency signal, such as, a high frequency signal. Preferably, frequency synthesizer 10 is a non-phase locked loop (PLL) based synthesizer that can be utilized in communication applications, such as, wireless communication applications (e.g., cellular phone applications). Synthesizer 10 includes a number of frequency sources 12A-D, a controller 16, and switches 14A-D. In one embodiment, synthesizer 10 is used for modulation (e.g., wideband modulation)

Preferably, sources 12A-D and switches 14A-D are in a one-to-one relationship. The number of sources 12A-D can be any number from two to n, and the number of switches 14A-D can be any number from two to n. Preferably, at least 2 number of sources 12A-D and switches 14A-D are utilized depending upon application parameters and system criteria. Switches 14A-D are preferably solid-state switches such as CMOS devices. Switches 14A-D can also be implemented as a multiplexer.

Frequency sources 12A-D have outputs coupled to each of switches 14A-D. Switches 14A-D have an output coupled to output 18 which is coupled to controller 16. Controller 16 has an output coupled to a control input of each of switches 14A-D via control lines 14A-D.

Sources 12A-D can be implemented as any type of frequency sources such as integer or fractional PLLs, Clock multipliers, or multiplying DLLs. In one preferred embodiment, sources 12A-D are digital delay locked loops (DLLS). Digital delay locked loops can be implemented as conventional DLLs.

In one alternative embodiment, frequency sources 12A-D are implemented by one delay locked loop with a programmable multiplier. This is a preferred implementation since one can recognize from FIG. 1 that when a particular switch is on, all the other switches are off. As an example, if switch 14A connected to source 12A is on, then switches 14B, 14C, 14D are all off. This means that the sources 12B, 12C, and 12D need not be on. Thus, the amount of hardware in the implementation may be reduced considerably by implementing a single frequency agile source which can generate signals associated with sources 12A, 12B, 12C, 12D as needed and as determined by the switches 14A to 14D.

Figure 8:
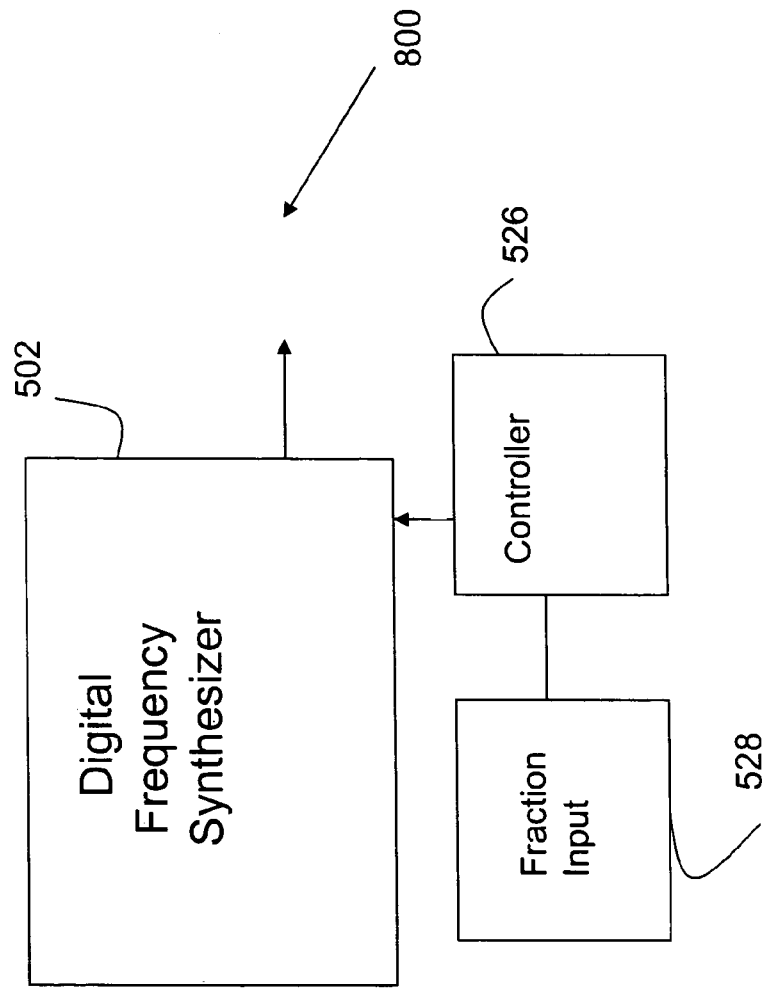
FIG. 8 is an electrical schematic block diagram of a digital frequency synthesizer in accordance with an exemplary embodiment.

In an alternative embodiment (FIG. 8), frequency synthesizer 500 includes, a single frequency source structure 502 (e.g., single source), such as, a multiplying DLL (integer or fractional). Source 502 provides the signals associated with sources 12A-D. In this embodiment, switches 14A-D are not necessary. A controller 526, similar to controller 16 described in more detail below can be utilized to cause structure 502 of synthesizer 500 to provide the appropriate sequence of signals. The sequence of signals preferably have an average frequency within the range of the signals provided by source 502. Controller 526 can receive a fraction value at input 528.

In operation, frequency sources 12A-D advantageously provide a set of n precise frequency signals. The desired frequency for a signal at output 18 is somewhere within the set of n precise frequencies. The desired frequency is variable and can change to any frequency within the set of n precise frequencies. For example, the desired frequency can be 905MHz and frequencies from sources 12A-D can be 890 MHz, 900 MHz, 910 MHz, and 920 MHz, respectively. As another example, if the desired frequency is 905 MHz, then the set of sources of 902 MHz, 904 MHz, 906 MHz, 908 MHz with the appropriate dithering between them will also result in 905 MHz.

The advantage of placing the tones closer to each other is that the resulting output phase noise, or jitter is considerably reduced. The tones can be spaced equally apart from neighboring tones in one embodiment. In another embodiment, the tones are not spaced apart equally from neighboring tones.

Figure 3:
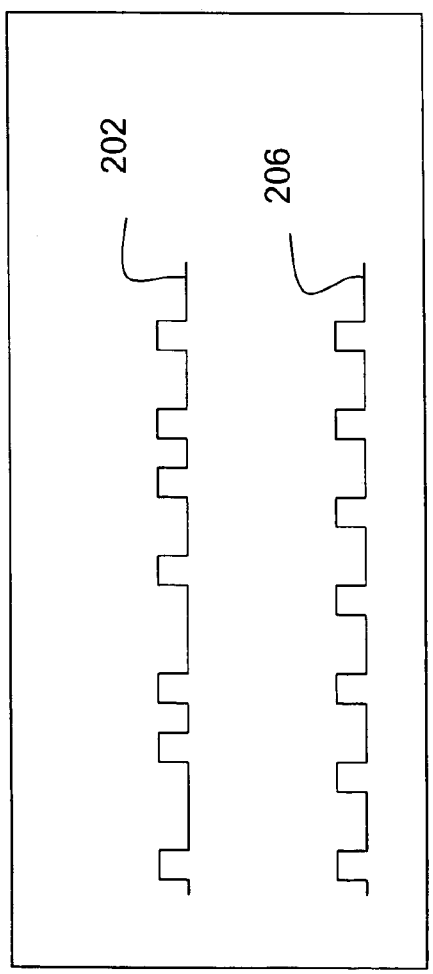
FIG. 3 is a waveform diagram of two waveforms associated with the synthesizer illustrated in FIG. 1 in accordance with an exemplary embodiment.
Figure 4:
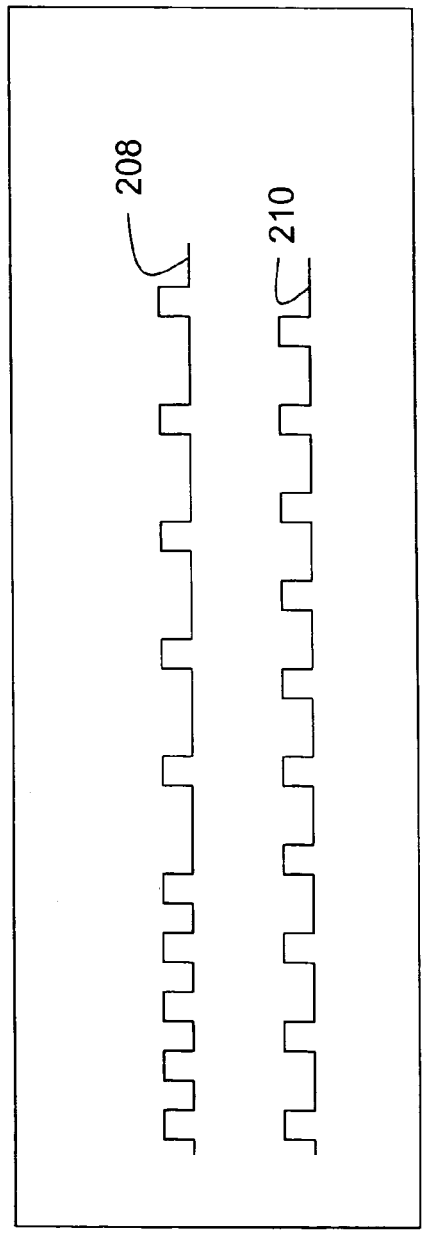
FIG. 4 is a waveform diagram of two waveforms associated with the synthesizer illustrated in FIG. 1 in accordance with yet another exemplary embodiment.

Controller 16 preferably controls individual switches of switches 14A-D over time so that the output signal with the desired frequency is provided at output 18. Controller 16 can receive a fraction factor from a fraction input 15. The fraction factor is used by controller 16 to control switches 14A-D to obtain the desired frequency. Controller 16 advantageously chooses the appropriate combination of frequency sources 12A-D over time via control lines 14A-D so that the desired frequency is obtained. Preferably, synthesizer 10 operates as essentially a variable clock signal source which jitters around the desired frequency as shown in FIGS. 3 and 4.

Synthesizer 10 can be a frequency synthesizer for use in a cellular phone. Synthesizer 10 advantageously allows very fast switching between frequencies and avoids the disadvantages associated with feedback loops. The rate of switching between switches 14A-D can be at a relatively low rate, e.g., at crystal frequency. Alternatively, output 18 can be coupled to controller 16 as in FIG. 1 to provide a much higher switching rate. Applicants believe that a faster switching rate for controller 16 and hence switches 14A-D results in a reduced noise floor. A frequency divider can be disposed between the output 18 and the controller 16 in order to reduce the rate at which controller 16 operates.

Fraction input 23 provides controller 16 the appropriate fraction for providing the desired frequency at output 18. Input 23 is similar to input 15 (FIG. 1). The fraction can be provided by a variety of circuits, controllers, etc. Controller 16 generates the appropriate sequence on outputs 20A, 20B, 20C, and 20D to achieve the frequency associated with the fraction (e.g., integer+fraction) provided by fraction input 23. Advantageously, synthesizer 10 can have a very high bandwidth due to the lack of the feedback loop.

Synthesizer 10 can operate as an open loop system without the use of feedback loops as in a standard PLL implementation. Synthesizer 10 preferably operates as a completely digital frequency source and is capable of being integrated in an all digital CMOS process. This feature in addition to the relatively small die size required for synthesizer 10 makes it very attractive for digital and analog integration.

Figure 2:
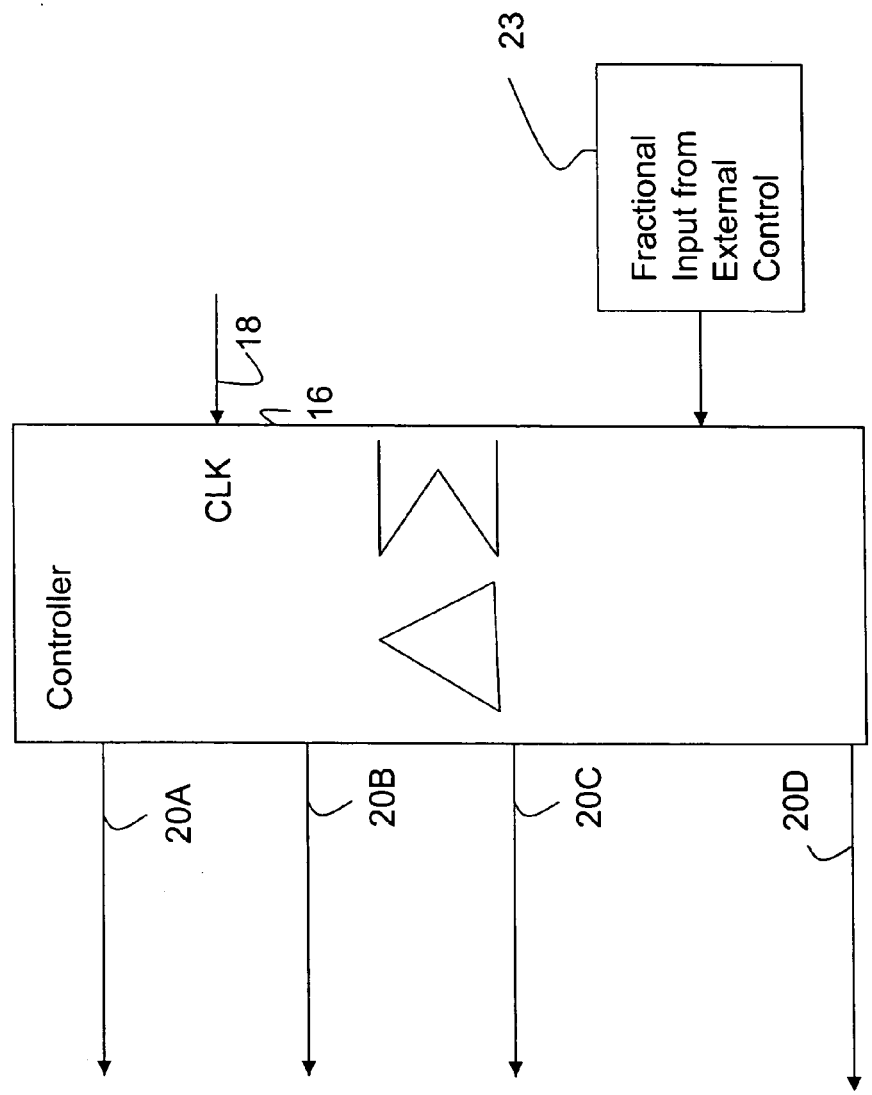
FIG. 2 is a more detailed block diagram of the controller illustrated in FIG. 1 in accordance with another exemplary embodiment.

With reference to FIG. 2, according to one preferred embodiment, controller 16 is implemented as a delta-sigma modulator or other dithering circuit. The delta-sigma modulator receives an indication of the desired frequency and provides a sequence of signals on control lines 14A-D to effect generation of the desired frequency signal.

An exemplary implementation of the delta-sigma modulator is in U.S. Pat. No. 4,609,881. The output of the delta-sigma modulator (or any dithering circuit) is a sequence of numbers that change at the clock rate. The input of the delta-sigma modulator (or any dithering circuit) is a fraction—for example, 0.3333. The property of the delta-sigma modulator (or any dithering circuit) is that the average of the sequence will be the input fraction. Note that the output is preferably integer numbers. Frequency dividers or multipliers generally can be made only as integer dividers or multipliers. In the example of the input being 0.3333, the output sequence can be 0, 2, −1, 1, 0, 0, −2, 3, 0, and so on. Note that the average of the sequence is 0.3333. Another property of the delta-sigma modulator is that the sequence repeats only after a very long period. Thus, we obtain a pseudo-random source and the jitter or noise at the output will not have spurious tones (since these spurious tones are caused by any periodic repetition in the dithering sequence).

Controller 16 can be implemented as a delta-sigma modulator using standard architecture implemented on a CMOS process. Applicants believe that synthesizer 10 advantageously splits up the two functions associated with the conventional fractional-N PLL circuit (the two functions are that of tone generation, and noise filtering). The architecture for synthesizer 10 uses digital implementation for frequency selection and uses a PLL for filtering of the output signal. This can also be viewed as a jitter removal circuit or clean-up PLL. This clean-up PLL may not be required in all applications. Applicants believe that only applications with very stringent phase noise requirements will require the clean-up PLL. Clean-up phase locked loop 34 is discussed with reference to FIG. 7. This division of two functions associated with a conventional PLL-base synthesizer advantageously reduces the power requirements and allows the use of digital circuitry for frequency synthesizer 10.

With reference to FIG. 3, synthesizer 10 provides an output signal 202. Output signal 202 can be frequency averaged to provide output signal 206, if necessary for the specific application. The averaging of the frequency of the signal 202 can be performed utilizing a clean up phase locked loop such as clean up phase locked loop 348 discussed with reference to FIG. 7.

Signal 202 is generated by selecting frequency sources 12A-D. As can be seen in the example, signal 202 has 8 pulses across the same time that signal 206 has 8 pulses. However, the pulses of signal 202 do not have the same period between them.

Signal 202 has pulse widths (or, equivalently, pulse frequency) that can be switched at each pulse. In this embodiment, the frequency of signal 202 can be changed on a pulse-by-pulse basis. Alternatively, controller 16 can control switches 14A-D at every nth pulse of the output clock.

Figure 7:
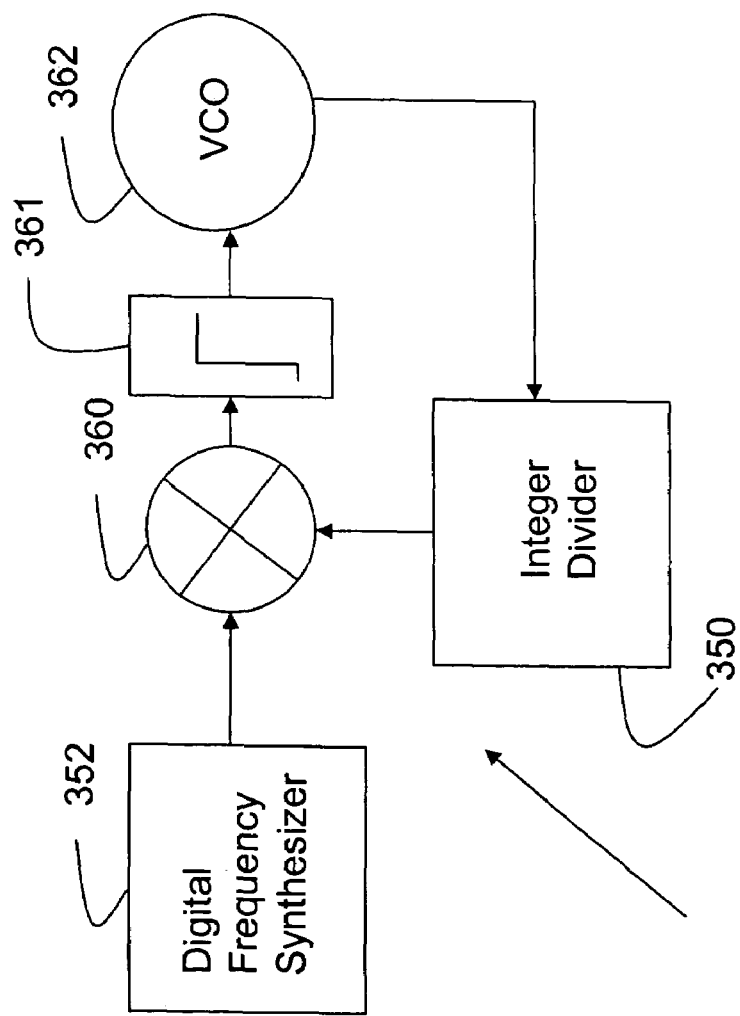

With reference to FIG. 4, signal 208 represents the signal at output 18. Signal 208 is provided in a synthesizer 10 configured so that controller 16 only selects switches 14A-D every 5 pulses, as an example. Signal 210 is an average or cleaned up version of signal 208 using phase locked loop 348 (FIG. 7).

Figure 5:
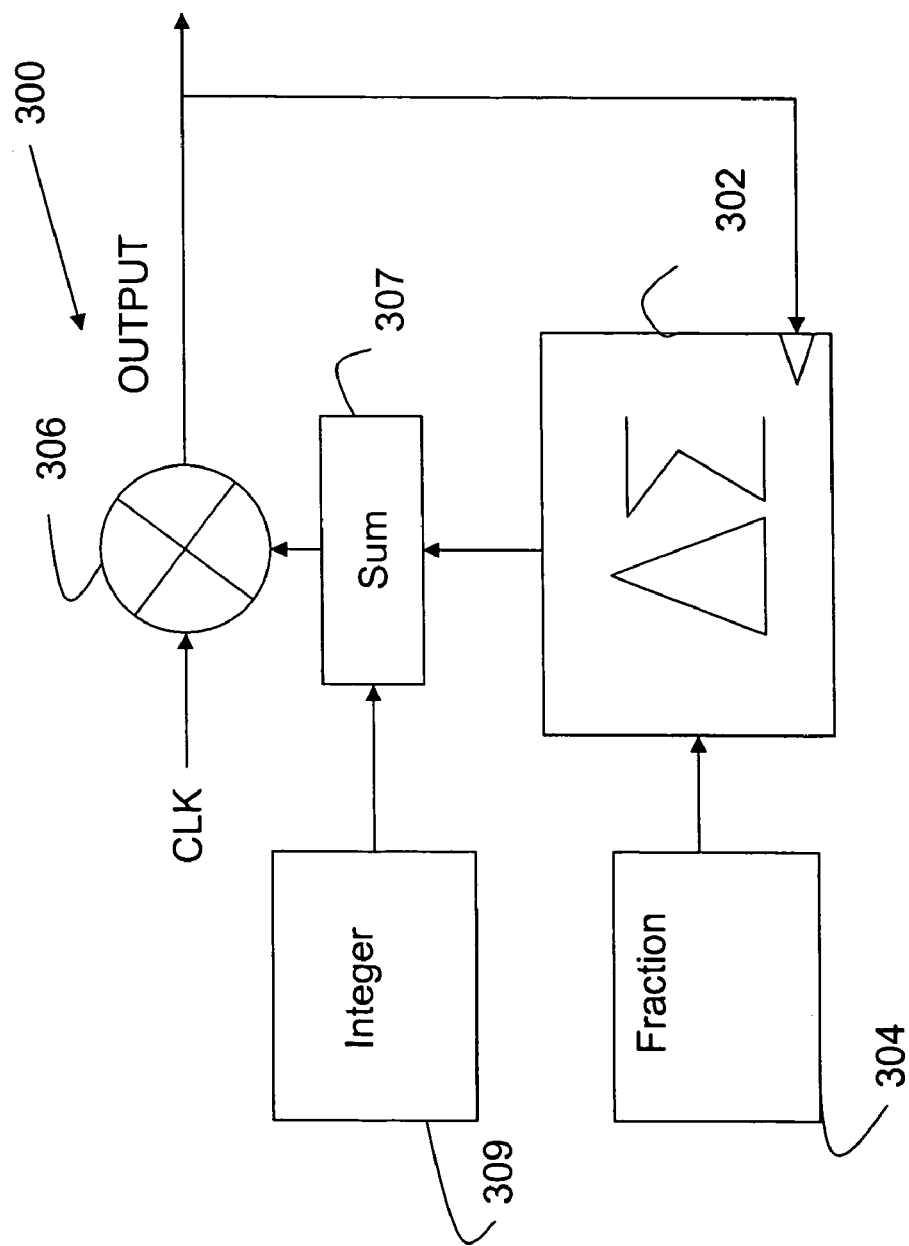
FIG. 5 is an electrical schematic block diagram of a digital frequency synthesizer in accordance with yet another exemplary embodiment.

With reference to FIG. 5, a digital frequency synthesizer 300 is similar to digital frequency synthesizer 10 and achieves similar advantages. Synthesizer 300 can be utilized to generate signals 202 and 208.

Synthesizer 300 includes a clock frequency multiplier 306, a dithering circuit (e.g., delta-sigma modulator 302), and a fractional input 304. Multiplier 306 receives a reference signal (CLK) at an input. The reference signal can be provided from any frequency source, such as a DLL, crystal oscillator circuit, etc. Multiplier 306 also includes an input for receiving a signal from a dithering circuit or (e.g., delta-sigma modulator 302). Dithering circuit or modulator 302 provides a signal to multiplier 306 through sum circuit 307. Sum circuit 307 receives an integer from integer input 309.

Sum circuit 307 adds the integer from input 309 to the fractional value from modulator 302. The integer is a suitable stable integer number so that the desired frequency output signal is provided at its output. In this implementation, the dithering circuit or delta sigma modulator 302 provides a sequence of integer numbers whose average represents the fraction provided by input 304. Each number in the sequence is added to the integer number which is then fed as input the clock frequency multiplier 306.

Multiplier 306 preferably functions in the following way: the output frequency is a multiple of the input clock frequency. The multiple is determined by the second input of the multiplier 306. For example, if the clock frequency is 7 MHz and the multiplication number is 100, then the output frequency is 7[100=700 MHz. If this number keeps on varying for each output pulse (or at a slower rate, but still related to the output pulse), then synthesizer 300 is able to generate the signals 202 or 208. Dithering/delta-sigma modulator circuits are discussed in more detail above with reference to FIG. 2.

Dithering circuit or delta-sigma modulator 302 can be clocked by the output signal from multiplier 306 or via an external clock signal. A fraction input 304 provides the appropriate fractional input for delta-sigma modulator 302.

Figure 6:
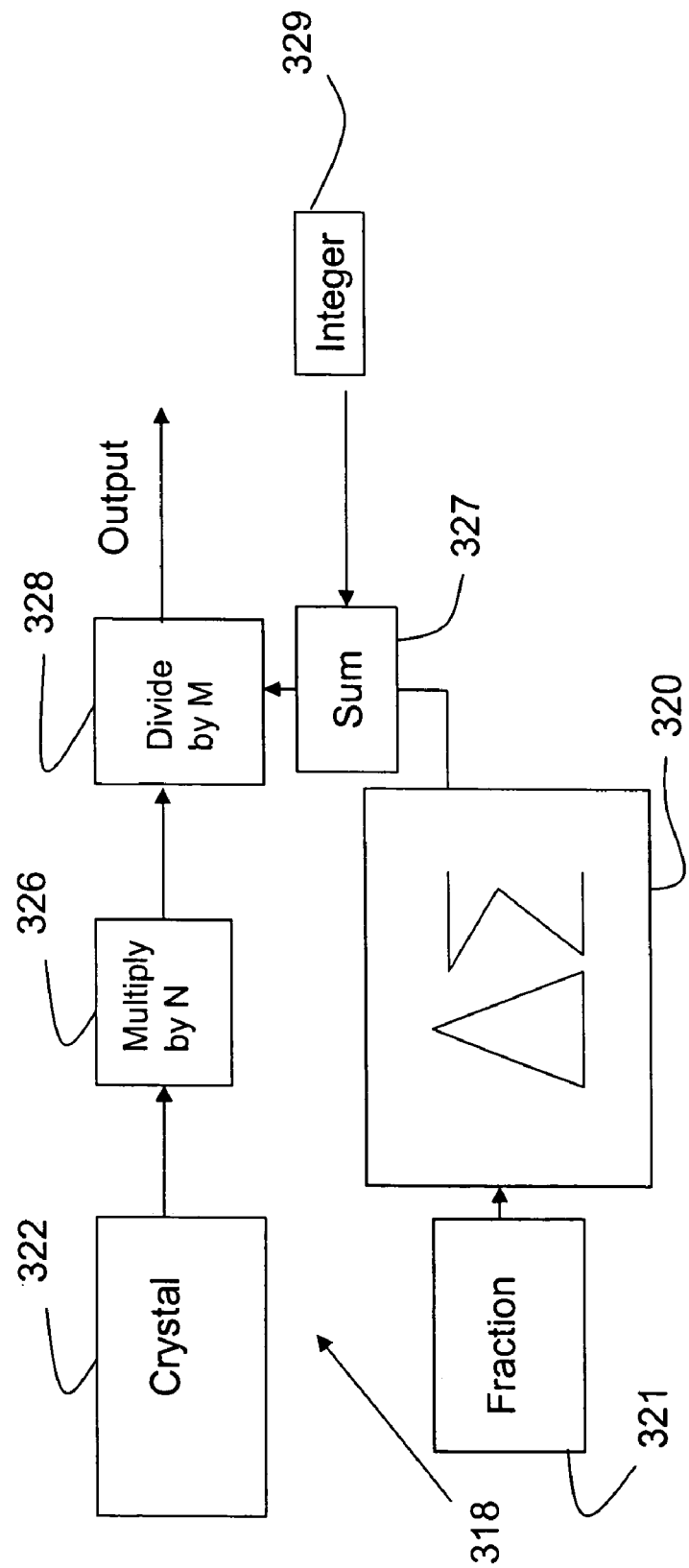
FIG. 6 is an electrical schematic block diagram of a frequency synthesizer in accordance with still another exemplary embodiment.

With reference to FIG. 6, a frequency synthesizer 318 is similar to synthesizer 10 and can achieve similar advantages. Synthesizer 318 includes a frequency source 322, such as a crystal oscillator circuit. Synthesizer 318 also includes a frequency multiplier 326, a dithering circuit or delta-sigma modulator 320, a fractional input 321 and a frequency divider (or counter) 328. Synthesizer 318 also can include an integer input 329 and a sum circuit 327. Divider 328 provides an output signal at a desired frequency. Dithering circuit (e.g., delta-sigma modulator 320) is coupled to divider 328 through sum circuit 327. Sum circuit adds the fractional output from modulator 320 to the integer from input 329.

Dithering circuit/delta-sigma modulator 320 controls divider 328 so that divider 328 provides the output signal at the desired frequency. Preferably, multiplier 326 is an integer multiplier. For example, if the required output frequency is 900 MHz, then in one implementation, the multiplier 326 preferably multiplies the signal from crystal 322 to a very high frequency such as approximately 9 GHz.

Divider 328 divides the signal down to a desired frequency such as 905 MHz. This is accomplished by dithering (or delta-sigma modulating) the divider input so that the desired frequency and jitter is present at the output. The functionality is very similar to synthesizer 300 (described above), except for the fact that a clock multiplier is used to generate the signals 202 or 208, while in synthesizer 318, a frequency divider is used to generate signals 202 or 208.

In one embodiment, multiplier 326 is a fixed multiplier and divider 328 is a variable divider controlled by a dithering circuit (e.g., delta-sigma modulator 320). Modulator 320 receives a signal to set the division for divider 328 from circuit 321.

With reference to FIG. 7, digital frequency synthesizer 352 can be coupled to clean-up synthesizer or phase locked loop 348. This clean-up synthesizer may be required to remove the jitter inherently present in synthesizers 10, 300, or 318. Synthesizer 352 can be implemented as any of synthesizers 10, 300 or 318. Synthesizer 352 provides a signal to phase locked loop 348. Phase locked loop 348 is a clean up phase locked loop for removing jitter and changing waveform 202 to 206 or 208 to 210. (FIGS. 3 and 4).

Phase locked loop 348 includes a Phase detector/Phase-frequency detector, or mixer 360, a voltage controller oscillator 362, a loop filter 361 and an integer divider 350. The use of integer divider 350 as opposed to a fractional divider provides easier implementation. Note that the integer division may be a division of 1. For this case, no physical circuit is needed since the input and output frequencies are the same. For systems, like Global System for Mobile Communications (GSM) where phase noise or jitter requirements are very difficult to achieve, loop 348 can be very advantageous. Other systems may not require loop 348. This separation of functions (filtering and fractional signal generation) allows digital implementation integrated in CMOS.

Applicants believe that the architecture of synthesizers 10, 300 and 318 allows them to be made much less expensively than a conventional PLL system. Applicants believe that synthesizers 10, 300 or 318 have lower power consumption than a conventional PLL and are completely digital and more resistant to switching noise. Modulation can be very effectively performed since the method is effectively open looped and there are fewer loop stability considerations. Applicants believe that synthesizer 10 provides better phase noise or jitter performance. Applicants believe that synthesizer 300 and 318 provide easier implementation at a reduced power consumption.

It is understood that, while the detailed drawings, specific examples, and particular component values given describe preferred exemplary embodiments of the present invention, they serve the purpose of illustration only. The apparatus and method of the invention is not limited to the precise details and conditions disclosed. Further, although particular types of frequency sources are discussed, various other components could be utilized for the digital frequency synthesizer. Other substitutions, modifications, changes, and omissions may be made in the design, operating conditions, and arrangement of the preferred embodiments without departing from the spirit of the invention as expressed in the appended claims.

What is claimed is:

1. A digital frequency synthesizer, comprising:
   at least one source for providing plurality of digital frequency signals, the digital frequency signals being provided at distinct frequencies;
   a plurality of switches coupled to receive the digital frequency signals; and
   a control circuit coupled to the switches, the control circuit controlling the switches to select the digital frequency signals and provide an output signal having an average frequency at a first frequency, the average frequency being within a range of the distinct frequencies, wherein the control circuit includes a clock input for receiving a clock signal, wherein the clock signal is the output signal or is derived from the output signal.

2. The digital frequency synthesizer of claim 1, wherein the control circuit includes a delta-sigma modulator.

3. The digital frequency synthesizer of claim 2, wherein the delta-sigma modulator includes the clock input.

4. The digital frequency synthesizer of claim 3, wherein the clock signal is the output signal.

5. The digital frequency synthesizer of claim 1, wherein wideband modulation is achieved.

6. The digital frequency synthesizer of claim 1, wherein the digital frequency signals are provided by at least one digital delay locked loop.

7. The digital frequency synthesizer of claim 1, wherein the digital frequency synthesizer is entirely integrated on a CMOS, bi-CMOS, silicon germanium, gallium arsenide device.

8. The digital frequency synthesizer of claim 1, wherein the digital frequency synthesizer is entirely implemented on a programmable gate array.

9. The digital frequency synthesizer of claim 1, further comprising a phase locked loop coupled to receive the output signal.

10. The digital frequency synthesizer of claim 9, wherein the phase locked loop includes an integer divider and the phase locked loop provides a cleaner version of the output signal.

11. The digital frequency synthesizer of claim 1, wherein the at least one source includes a plurality of digital frequency sources coupled to the switches, the digital frequency sources individually providing the digital frequency signals.

12. The digital frequency synthesizer of claim 1, wherein a tone spacing between the digital frequency signals is a fixed amount.

13. The digital frequency synthesizer of claim 1, wherein a tone spacing between the digital frequency signals is a non-fixed amount.

14. A digital frequency synthesizer, comprising:
   at least one source for providing plurality of digital frequency signals, the digital frequency signals being provided at distinct frequencies;
   a plurality of switches coupled to receive the digital frequency signals; and
   a control circuit coupled to the switches, the control circuit controlling the switches to select the digital frequency signals and provide an output signal having an average frequency at a first frequency, the average frequency being within a range of the distinct frequencies, wherein the control circuit includes a dithering circuit or a delta sigma modulator.

15. A digital frequency synthesizer, comprising:
a frequency source for providing a first signal at a first frequency;
a frequency multiplier for receiving the first signal and providing a second signal at a second frequency, the second frequency being a fixed integer multiple of the first frequency;
a variable frequency divider for receiving the second signal and providing a third signal having an average third frequency, the average third frequency being less than the second frequency;
a dithering circuit, wherein the divider is controlled by the dithering circuit so that the third frequency is an average of a dithering sequence from the dithering circuit.

16. The digital frequency synthesizer circuit of claim 15 further comprising:
a clean phase locked loop coupled to receive the third signal to clean the third signal.

17. The digital frequency synthesizer circuit of claim 15 wherein the dithering circuit is a delta-sigma modulator.

18. The digital frequency synthesizer of claim 15 wherein wideband modulation is obtained.

19. The digital frequency synthesizer of claim 14 wherein wideband modulation is obtained.

20. The digital frequency synthesizer of claim 4 wherein wideband modulation is obtained.

21. A digital frequency synthesizer, comprising:
a plurality of digital frequency signal sources for providing plurality of digital frequency signals, the digital frequency signals being provided at distinct frequencies;
a plurality of switches coupled to receive the digital frequency signals; and
a control circuit coupled to the switches, the control circuit controlling the switches to select the digital frequency signals and provide an output signal having an average frequency at a first frequency, the average frequency being within a range of the distinct frequencies, wherein the control circuit includes a clock input for receiving a clock signal, wherein the clock signal is the output signal or is derived from the output signal.

22. The digital frequency synthesizer circuit of claim 14 further comprising: a clean-up phase locked loop coupled to receive the output signal to clean the output signal.

23. The digital frequency synthesizer of claim 14, wherein the digital frequency synthesizer is entirely integrated on at least one of a CMOS, bi-CMOS, silicon germanium, gallium arsenide device.

24. The digital frequency synthesizer circuit of claim 21 further comprising:
a clean phase locked loop coupled to receive the output signal to clean the output signal.

25. The digital frequency synthesizer of claim 21, wherein the digital frequency synthesizer is entirely integrated on at least one of a CMOS, bi-CMOS, silicon germanium, gallium arsenide device.

* * * * *